MAKING CIRCUIT BOARDS
Filed Aug. 15, 1966 3 Sheets-Sheet 1
Fig. 1
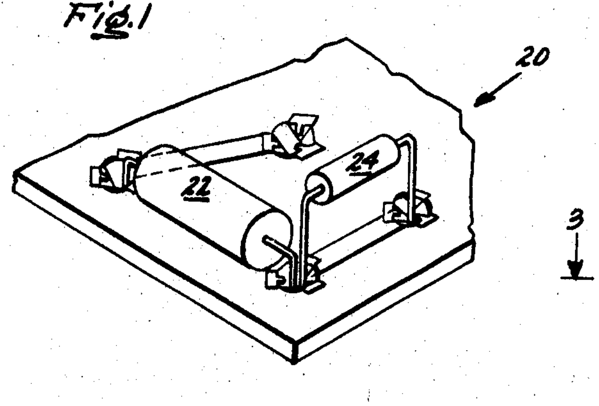
Fig. 2
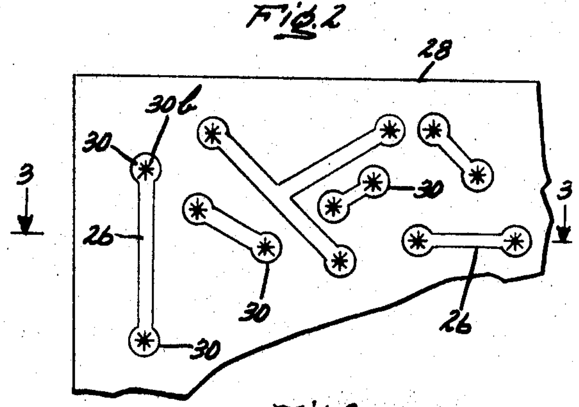
Fig. 2a
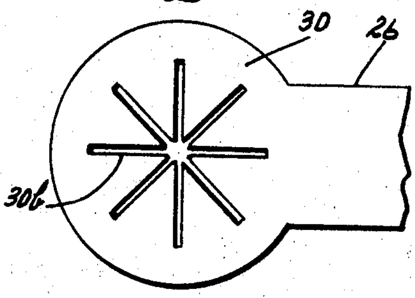
Fig. 3
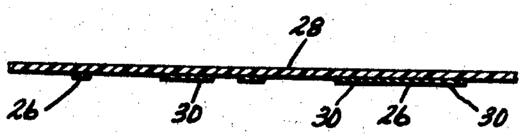
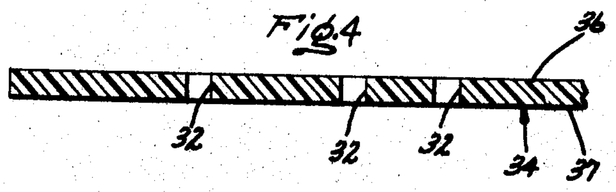
Fig. 5
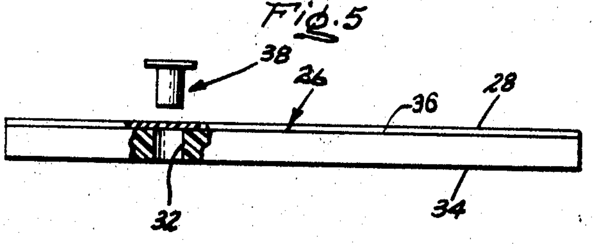
Fig. 7
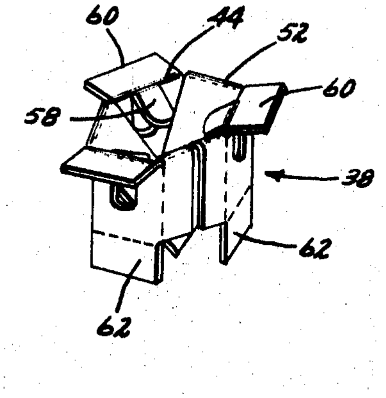
Fig. 6
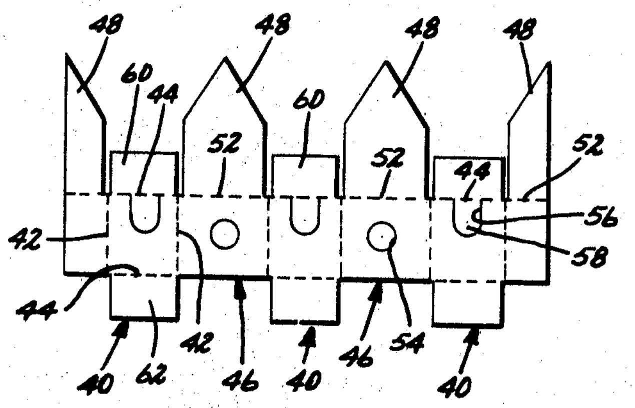
INVENTOR.
Andrew S. Gall,
BY Hood, Gust & Irish
Attorneys.

Sept. 15, 1970 A. S. GALL 3,528,173

MAKING CIRCUIT BOARDS

Filed Aug. 15, 1966 3 Sheets-Sheet 2

Inventor:
Andrew S. Gall
by Hood, Gust & Irish
Attorneys

Inventor:
Andrew S. Gall,
by Hood, Gust & Irish
Attorneys.

United States Patent Office
3,528,173
Patented Sept. 15, 1970

3,528,173
MAKING CIRCUIT BOARDS
Andrew S. Gall, 10537 Leo Road, Fort Wayne, Ind. 46805
Filed Aug. 15, 1966, Ser. No. 572,579
Int. Cl. H05k 3/30, 3/00; H01r 43/00
U.S. Cl. 29—626 9 Claims

ABSTRACT OF THE DISCLOSURE

The instant disclosure is a process of providing a circuit assembly by first providing a circuit pattern upon a heat dissipatable carrier and bonding said carrier and attached circuit to an apertured insulator board with at least a part of the circuit and carrier extending over the edge of each aperture. A terminal is then forced into the hole and against the overhanging circuit carrier to bend some therein. Then a flow solder operation secures the terminal to the circuit during which time the carrier in the aperture is heat dissipated.

The present invention relates to a circuit board and method of making the same, and more particularly to an improved circuit board and method which lead to economy, reliability and compactness.

Circuit boards, commonly referred to as printed circuits, are conventionally fabricated of a substantially rigid substrate made of a suitable insulating material having a thin film of copper or the like upon one surface of the substrate. Many different techniques have been and are being used in the application and formation of the copper circuit to the board.

The present invention relates to such circuit boards, and provides for a unique structure and method of making the same whereby greater reliability, economy and ease of assembly are realized.

It is an object of this invention to provide a method of fabricating a circuit board which is simple, economical and facile in the practice thereof.

It is another object of this invention to provide a circuit board uniquely constructed to provide a reliable electronic circuit in a finished structure which is more compact than comparable structures.

It is still a further object to provide a unique terminal structure which facilitates fastening of component leads to printed circuitry and furthermore facilitates soldering.

Other objects will become apparent as the description proceeds.

The above-mentioned and other features and objects of this invention and the manner of attaining them will become more apparent and the invention itself will be best understood by reference to the following description of an embodiment of the invention taken in conjunction with the accompanying drawings, wherein:

FIG. 1 is a fragmentary perspective of one embodiment of this invention;

FIG. 2 is a top plan view of a typical printed circuit used in this invention;

Figure 8:
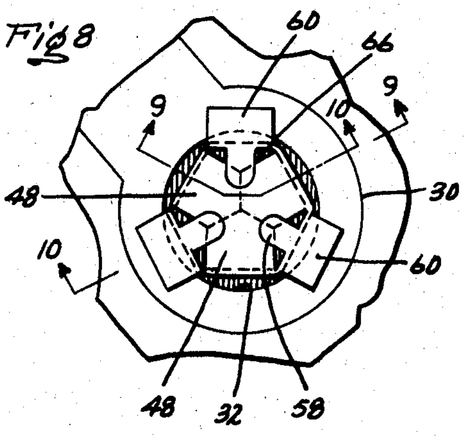
Figure 9:
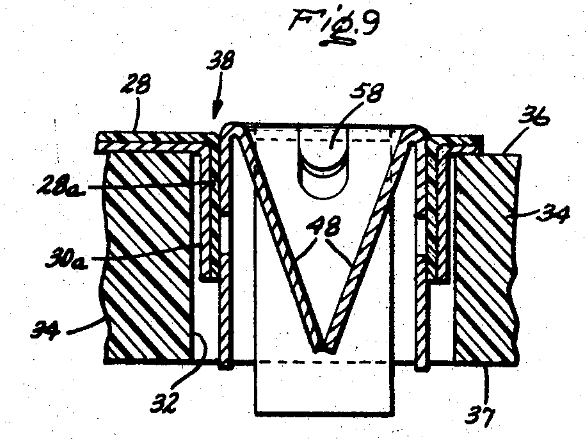
Figure 10:
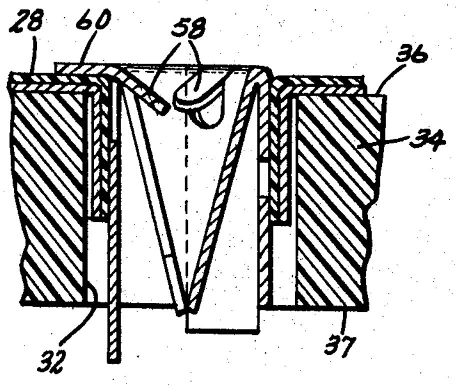
Figure 11:
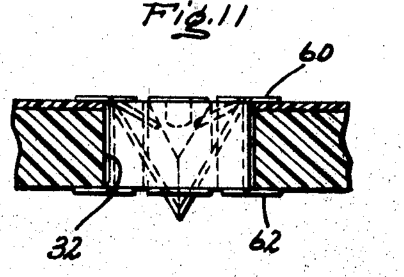
Figure 12:
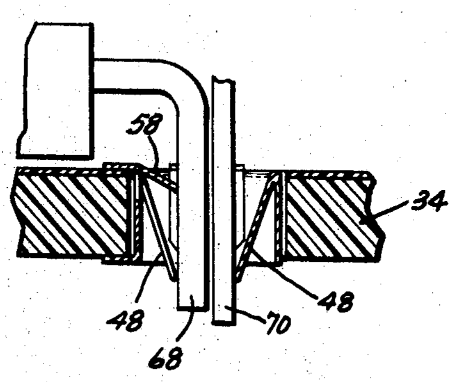
Figure 13:
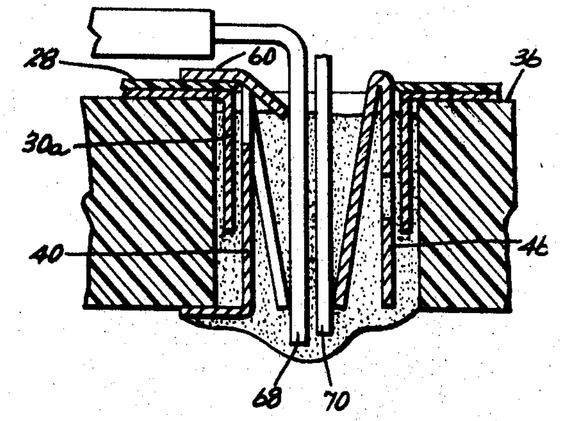
Figure 14:
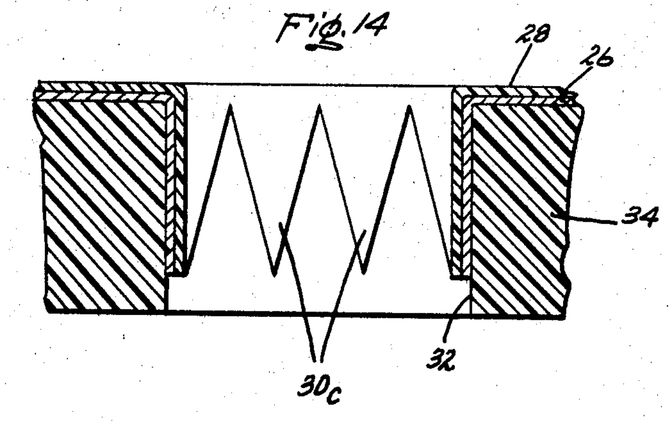
Figure 15:
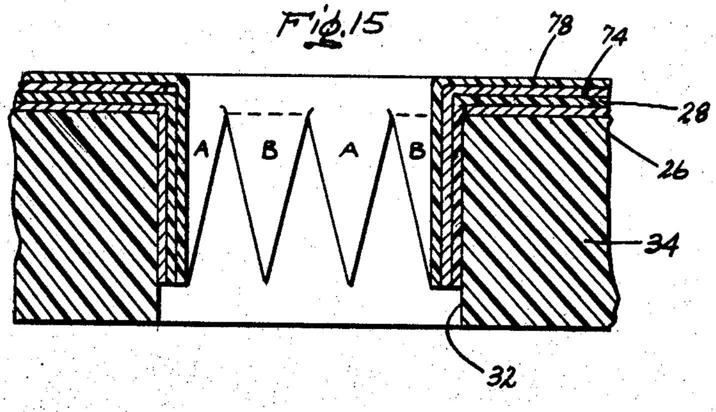
Figure 16:
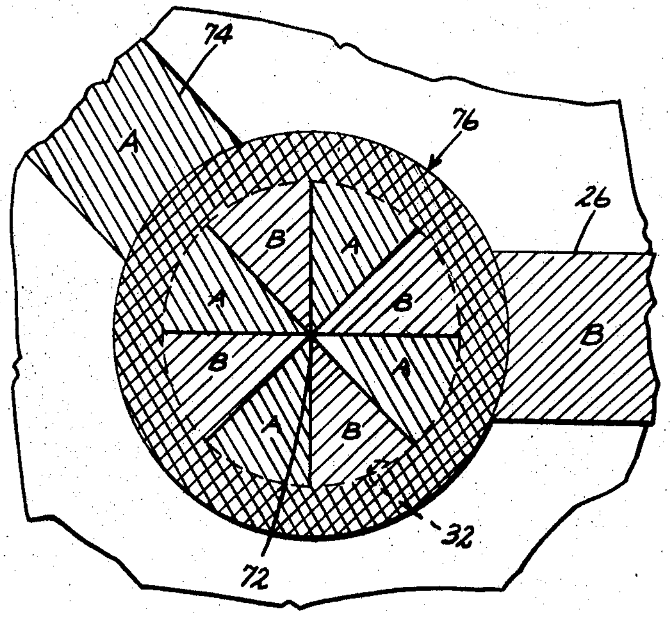

FIG. 2*a* is an enlarged top plan view of one of the circular copper portions of the circuit of FIG. 2;

FIG. 3 is a sectional view taken substantially along section line 3—3 of FIG. 2;

FIG. 4 is a sectional view of a conventional insulator board shown in position beneath the structure of FIG. 3 for the purpose of explaining one step in the method of this invention;

FIG. 5 is an edge view of a partially assembled circuit board, partially sectioned for clarity, and is used in connection with explaining another step in the method of this invention;

FIG. 6 is a view showing a terminal of this invention developed into a flat plane;

FIG. 7 is a perspective illustration of the same terminal shaped and assembled ready for insertion into a circuit board;

FIG. 8 is a top plan view of a portion of the circuit board showing the terminal of FIG. 7 assembled thereto;

FIG. 9 is an enlarged fragmentary sectional view taken substantially along the section line 9—9 of FIG. 8;

FIG. 10 is a similar sectional view taken substantially along the section line 10—10 of FIG. 8;

FIG. 11 is still another similar sectional view showing the terminal completely assembled to a circuit board;

FIG. 12 is still another fragmentanry sectional view of the terminal arrangements of FIGS. 9 through 11 inclusive but showing the leads of certain components fitted into the terminal in readiness for soldering;

FIG. 13 is a fragmentary sectional view of the arrangement of FIG. 12 but with the terminal, the printed circuitry and the component leads properly soldered together;

FIG. 14 is a sectional view showing the positioning of the copper circuit-plastic carrier in a terminal hole of the insulator board in the absence of the terminal of FIG. 7;

FIG. 15 is a sectional view similar to FIG. 14 of another embodiment of this invention; and FIG. 16 is a fragmentary top plan view of the arrangement of FIG. 15 prior to folding of the copper circuit and plastic carrier downwardly into the terminal hole of the insulator board.

Referring to the drawings, and more particularly to FIG. 1, the finished printed circuit board is indicated by the numeral 20 and is shown as having typical resistor and capacitor components 22 and 24 assembled thereto. The remaining description is directed to an explanation of the structure and method involved in achieving this particular circuit board 20.

Referring to FIGS. 2 and 3, a conventional printed copper circuit is there shown in which the circuit itself is composed of thin film copper, indicated by numeral 26, suitably adhered to a carrier 28 of insulating material, this particular carrier 28 being a flexible film of polyester material conventionally known as "Mylar." More particularly, this film 28 is similar to cellophane in appearance, being transparent and capable of being wound on a roll for storage and use.

The printed circuit 26 has circular enlargements 30 which are terminal sections for connection to circuit components and other similar circuit elements.

Referring now more specifically to FIGS. 3 and 4, a conventional supporting board 34, adequately rigid, of insulating material is prepunched with terminal holes 32 positioned to register with all of the terminal sections 30 of the printed circuit. This registry is illustrated by the relative positions of the two drawings of FIGS. 3 and 4, it being noted that the terminal sections 30 are centered with respect to the holes 32.

The conductive circuit 26 on the carrier 28 is superposed onto the upper surface 36 of the board 34 and adhered thereto by means of either a thermosetting or thermoplastic cement. All of the terminal sections 30 are centered over respective holes 32. The resulting structure is a laminate as shown at FIG. 5 wherein the printed circuitry 26 is sandwiched between the flexible carrier 28 and the rigid board 34.

A connecting terminal, generally indicated by numeral 38 and shown in position in FIG. 5 above hole 32, generally resembles an eyelet having a laterally extending flange and hollow body as shown. While a more detailed explanation is given later on, for the moment it is sufficient to understand that terminal 38 is made slightly smaller in outer diameter than hole 32, such that it can be inserted into hole 32 through a pierced carrier 28 and copper terminal section 30. The net result is that a certain portion of carrier 28 and section 30 are folded into hole 32 to a position between the terminal 38 and board 34. This too will be explained more fully later on.

The terminal 38, illustrated more clearly in FIGS. 6 and 7, will now be described in detail. This terminal is fabricated of sheet metal by a stamping operation in the planar form shown in FIG. 6. In this FIG. 6, the dashed lines indicate folding or bending lines while the solid lines indicate the outline or shape of the stamping from which terminal 38 of FIG. 7 is formed. Briefly, the stamping of FIG. 6 includes several side portions, there being, for all practical purposes, six such portions. Three of the portions, indicated generally by numeral 40, are identically shaped, rectangular portions having orthogonal centers outlined by the dashed lines 42 and 44 as shown. The remaining side portions, indicated generally by numeral 46, are also generally rectangular with the exception of pointed tabs 48 which are joined to orthogonal portions at dashed lines 52 as shown. Each of the orthogonal portions of sides 46 are provided with holes 54 for a purpose which will become apparent from the description that follows.

Extending from one of the dashed lines 44 in each of the side sections 40 is a U-shaped aperture, indicated by numeral 56, from which ears 58 may be bent, the bend line being along the line 44. This will be explained in more detail later on.

The opposite ends of the stamping of FIG. 6 constitute or are formed as a half of one of the side portions 46; however, it will appear as obvious to persons skilled in the art that this division line may occur along one of the dashed lines 42 without departing from the spirit and scope of this invention.

The stamping of FIG. 6 is bent to the shape shown in FIG. 7 before insertion into the printed circuti board. The bending sequence may vary; however, one method of realizing the shape of FIG. 7 is by first bending the pointed tabs 48 in the same direction along the fold lines 52 until they form an acute angle with the plane of the original stamping. Next, all of the side portions 40 and 46 are bent along the fold lines 42 to the hexagonal shape of FIG. 7. Each of the portions 40 have oppositely extending flange portions 60 and 62, the portion 60 being bent outwardly at right angles along the fold lines 44 as shown in FIG. 7. Lastly, the ears 58 are bent outwardly from the side sections as shown. Further details regarding the construction of this terminal 38 will be obtained from the remaining FIGS. 9 through 13 and the description tht follows.

Referring once more to FIG. 5, the terminal 38, as shown in FIG. 7, is inserted into opening 32 from the top side 36 of board 34. In doing so, carrier 28 as well as the terminal section 30 are laid against the sides of the opening 32 by the progressive insertion of terminal 38 into hole 32. The parts of carrier 28 and section 30 that are folded into the hole 32 are shown more clearly in FIGS. 9, 10 and 14 and are indicated by the numerals **28*a*, 30*a* and 30*c*, respectively. In this particular embodiment, it will be noted that carrier part 28*a* is positioned between terminal 38 and the side of hole 32**.

At this point, reference being made to FIG. 8, it should be noted that in cross-section the terminal 38 is substantially hexagonal with the corners defining a circle of substantially the same size as hole 32. This being true, an arcuate space is provided between hole 32, and each of the flat terminal sides, as is shown more clearly in the two FIGS. 9 and 10.

Flanges 60 overlie carrier 28 as well as terminal section 30 and surface 36 of board 34 in the vicinity surrounding hole 32 as shown. The ears 58 are bent at somewhat shallow angles as shown and overlie the open spaces between tabs 48 indicated by numeral 66 in FIG. 8, these ears 58 being much smaller than tabs 48. Tabs 48 are bent at a sharper angle with respect to the terminal sides as shown and extend downwardly and inwardly toward each other until they engage at the apices thereof to provide an essentially closed well or cavity which may be visualized by considering the three FIGS. 8, 9 and 10. These tabs 48 preferably are resilient and flexible, and this is conveniently achieved by forming the stamping of FIG. 6 from half-hard brass or the like.

With terminal 38 inserted as shown in FIGS. 9 and 10, the next step is to fold flange portions 62 which project beneath the bottom surface 37 of the board 34 outwardly into intimate engagement with this surface 37. This is shown more clearly in FIGS. 11, 12 and 13. The terminal 38 is now securely clamped into hole 32, and additionally tthe carrier 28 as well as the copper 26 are securely, physically clamped to the printed board 34 in the vicinity of hole 32.

The board is now ready for the connection of wire-like leads to terminals 38. This is accomplished quickly and easily by inserting component leads and wire ends such as those indicated by numerals 68 and 70, respectively, in FIG. 7, into the terminal 38, both the tabs 48 and the ears 58 serving to direct these leads toward the center of terminal 38 until they reach the apex of the well formed by the engaged tabs 48. Further penetrating force exerted on leads 68 and 70 merely results in pushing tabs 48 to one side, as shown in FIG. 12, the resilience of the tabs causing them to grasp or clinch the leads 68 and 70. By forming the terminals 38 from sufficiently thick material, the grasping force of the tabs 48 will be and is sufficient to hold the components 22 and 24 (FIG. 1) fastened to the leads 68 and 70 in place on the circuit board. Thereafter, the circuit board with the components mounted may be pretested prior to soldering and otherwise may be handled with ordinary care without fear of the components falling therefrom.

Lastly, a soldering operation is performed which, as shown in FIG. 13, solders leads 68 and 70 to all of the terminal parts including the tabs 48, the side portions 40 and 46, and also to the copper part **30*a* of the printed circuit 26. In performing this soldering operation, almost any of the conventional methods may be used. The soldering may be performed from the top or bottom of the board 34. The usual soldering iron may be used, as well as dip or flow soldering. In soldering, the terminal 38 rapidly heats to soldering temperature by applying thereto a soldering iron or molten solder. It is quite obvious that in order for a soldering bond to be made to the copper 30*a*, it is necessary that the protective carrier 28*a* be removed. By using the material previously described, in this instance being a polyester film known as "Mylar," the carrier dissipates and otherwise disappears when it is subjected to elevated soldering temperatures. Thus, at room temperatures and somewhat above, the carrier 28 and 28*a* remain intact as previously described. However, during the process of soldering, the carrier part 28*a* dissipates when heated to temperatures somewhat below soldering temperatures, thereby exposing the clean surfaces of the copper part 30*a*** to the molten solder. By this means, a secure solder bond between the printed circuit and all of the other parts of the assembly can be made.

The cement or material used to adhere the carrier 28 and the printed circuit 26 to the upper surface 36 of the circuit board 34 may be either thermoplastic or thermosetting. Such material should be a good insulator and any of the well known cements used in the fabrication of printed circuits and the like may be used. In some instances, it may be desired to use a thermoplastic material, because when the assembly shown in FIG. 12 is subjected to the heat of soldering, the thermoplastic cement will soften but will not dissipate in the soldering regions. Following soldering and the cooling period, the thermoplastic material rehardens and will tend to bond the circuit 26 to the walls of the hole. Thus, the finished assembly is an integrated printed circuit having the carrier 28 as a protective covering for the circuit 26.

As is clearly shown in the drawings, the construction of this invention is such that all of the soldering occurs substantially within the thickness of the board 34. Also to be recognized is the fact that the terminal 38 is so constructed that its dimensions are kept substantially within the thickness of the board 34, all of which provides a thinner overall assembly.

Another unique feature is the fact that soldering of the terminal 38 and leads thereto may occur from either the top or the bottom. Also, all circuit assembly operations may be performed from the top of the board 34, thereby simplifying assembly operations. On the other hand, all of the assembly of the mechanical parts may be performed from the top side and soldering by either dip or flow from the underside.

Of substantial importance is the fact that the method and devices of this invention permit the fabrication of a rigid circuit board in a manner which is economical, facile and reliable. For example, the subassembly of the printed circuit 26 and the carrier 28 is mass-produced according to conventional techniques. Individual, identical circuits may be contained on a long web of the carrier 28, which is packaged in roll form. Then, as the individual circuits are needed, the carrier 28 with circuit thereon is unrolled and a proper length thereof severed for direct application to the board 34. Using a longer pointed version of the particular terminal 38 by which the carrier 28 and the copper sections 30 thereon may be pierced further facilitates fabrication of the circuit board.

The terminal 38 additionally is so constructed as to mount or secure component electronic parts in place prior to soldering operations as already explained in connection with FIGS. 1 and 12.

While the terminal 38 has been disclosed as being hexagonal in shape, it should be understood that any number of sides may be used so long as the mounting, soldering and piercing functions are not disturbed.

While the terminal holes on the board 34 have been illustrated as being round, it will also appear as obvious to persons skilled in the art that they may be of other shapes. It is important, however, that the terminal and holes be so related that when the terminal is inserted into the hole, it will be automatically centered therein. This therefore assures that good soldering connections may be made to the copper circuitry.

By using a round hole and a multi-sided terminal as disclosed, spaces are provided for gases to escape during the soldering operation and for solder to contact intimately the parts to be soldered. Any gases created by the dissipation of the carrier 28 or 28*a* during soldering, of course, would have a ready means of escape and would therefore not interfere with soldering.

In order to facilitate penetration of the pre-piercing tool and terminal 38 through the carrier 28 and copper section 30, the sections 30 may be provided with a series of radiating lines 30*b* of etched-out copper as shown in FIGS. 2 and 2*a* all crossing at the center of the area of the section 30. By locating this center over the center of the hole 32 and then inserting the terminal 38, the portions 30*c* of the copper around this center, which are triangular in shape, are merely folded downwardly into the hole as shown in FIG. 14. This assures that the hole 32 has a fairly even distribution of copper around the periphery thereof for soldering to the terminal 38.

In obtaining the even distribution of the copper triangles 30*c* about the periphery of the hole 32, the carrier 28 may be precut or indented along the same cuts 30*b* so that both the copper and carrier will separate into the triangular shapes upon insertion of the terminal 38 therethrough. Alternatively, a piercing tool may be used which precuts the carrier and copper along the lines 30*b* such that insertion of the terminal 38 will result in folding of the triangles 30*c* against the hole periphery.

Referring now to FIGS. 15 and 16, a second embodiment of this invention will be described. Like numerals will indicate like parts. As shown in FIG. 15, the copper circuit 26 is sandwiched between the plastic carrier 28 and the insulator board 34. In the initial steps of the method, instead of the copper circuit 26 covering the entire hole 32, the hole-covering portion thereof is segmented into triangularly shaped parts having the apices disposed adjacent to the hole center 72. In FIG. 16, the segments of the circuit 26 are indicated by the letter A, these segments being separated by triangular spaces. In the drawing, in order to identify the segments A as being connected to or a part of the circuit 26, they are all hatched similarly.

Superposed on the carrier 28 is another circuit 74 of the same material and character as the circuit 26, this circuit 74 having an identical series of triangular segments B (FIG. 16) which are circumferentially interleaved with the segments A. The segments B have apices disposed adjacent to the hole center 72.

Both of the circuits 26 and 74 have circular, terminal portions 76 which overlie the hole 32, the segments A and B being parts of these circular portions 76. A layer 78 of plastic, like the layer 28, covers the circuit 74 such that the latter is sandwiched or laminated between the two layers 28 and 78.

Preferably, the copper circuit 74 and the carrier 78 are pre-assembled the same as the two elements 26 and 28 as previously described. Thus, following the application of the two elements 26 and 28 to the insulator board 34, the prelaminated assembly 74, 78 is adhered to the element or layer 28.

With the circuit and carrier laminations adhered to the insulator board 34 in the positions already described and shown in FIG. 16, the carriers 28 and 78 are preferably pierced by a needle-like instrument at the center 72. The terminal 38 (FIG. 7) is inserted into the hole 32, the carriers 28 and 78 are separated into triangular parts and folded downwardly into engagement with the periphery of the hole 32 along with the segments A and B. The segments A and B thereupon will be positioned circumferentially adjacent to each other as shown in FIG. 15.

After the terminal 38 has been inserted into the hole 32, as described hereinbefore, the soldering operation is performed precisely as previously described. The material of the carrier 28 and 78 dissipates, thereby leaving bare copper free for soldering to the terminal. Since all segments A and B thereby become soldered to the terminal, they in turn are conductively connected to each other. Thus, by the simple expedient of providing superposed, prelaminated carrier assemblies, a single terminal insertion and soldering operation may be used for connecting two different circuits 26 and 74 together.

It will now appear obvious to persons skilled in the art that multiple circuits may be stacked or laminated onto the board as just described and soldering connections made therebetween by use of the terminals 38.

While there have been described above the principles of this invention in connection with specific apparatus, it is to be clearly understood that this description is made only by way of example and not as a limitation to the scope of the invention.

What is claimed is:

1. The method of fabricating a circuit board having a thin conductive circuit thereon comprising the steps of:

(a) providing a rigid insulator board having at least one terminal hole therethrough, said board having top and bottom surfaces through which said hole opens;

(b) providing a thin film conductive circuit on one surface of a carrier of flexible, film-like, solder-heat dissipatable insulating material;

(c) superposing said carrier with said conductive circuit thereon on said top surface of said board and adhering said carrier and circuit thereto, said carrier and circuit respectively having portions extending over and beyond the edge of said hole;

(d) bending said carrier and circuit portions into said hole and closely adjacent the wall thereof by forcing conductive terminal means against said portions and into said hole;

(e) and solder-bonding said circuit portion in said hole to said terminal means while simultaneously dissipating said carrier portion in said hole.

2. The method of claim 1 comprising the further step of securely clamping said terminal means to said board and to said carrier and circuit on said top surface adjacent said hole.

3. The method of claim 1 wherein said circuit is sandwiched between said board and said carrier.

4. The method of claim 3 wherein said solder-bonding step comprises flowing molten solder against said terminal means, and said carrier and circuit portions in said hole whereby the heat of said molten solder dissipates said carrier portion thereby exposing said circuit portion to said terminal means for direct soldering thereto.

5. The method of claim 4 wherein said terminal means comprises a hollow terminal element having opposite ends with a flange at one end thereof, said flange overlying the carrier in the peripheral margin around said hole upon forcing of said terminal element into said hole, and comprising the further step of forming the other end of said terminal element into clamping engagement with said bottom surface of said board.

6. The method of claim 5 wherein said terminal element has internal clinching tabs initially operatively engaged with each other and which are resiliently separable, and comprising the further step of inserting a component lead into said terminal element and into engagement with said tabs for separating the same whereby said tabs resiliently engage said lead, and then performing said solder-bonding step thereby to solder said circuit portion, terminal element and lead together.

7. The method of claim 6 wherein said terminal element has portions spaced from the wall of said hole thereby to provide gas escape space therebetween, said solder-bonding step being performed from said bottom side of said board.

8. The method of claim 3 comprising the further steps of providing a second prelaminated assembly of a second thin film conductive circuit on one surface of a second carrier of flexible, film-like solder-heat dissipatable insulating material, adhering said second assembly to the exposed surface of said first-mentioned carrier with said second circuit being sandwiched between said first and second carriers, said second carrier and second circuit respectively having portions overlying said first carrier and first circuit portions, said bending step including bending said second carrier and second circuit portions into said hole, and said solder-bonding step including soldering both of said circuit portions to said terminal means while simultaneously dissipating both of said carrier portions in said hole.

9. The method of claim 8 comprising the further step of arranging segments of each of said circuit portions circumferentially about a given center point with the segments of said first circuit portion being angularly interleaved between segments of said second circuit portion.

References Cited

UNITED STATES PATENTS

| | | | |
|---|---|---|---|
| 1,939,130 | 12/1933 | Mills. | |
| 2,502,291 | 3/1950 | Taylor | 29—626 XR |
| 3,024,151 | 3/1962 | Robinson. | |
| 3,213,404 | 10/1965 | Hedstrom. | |
| 3,328,782 | 6/1967 | Hoagland et al. | 29—625 |
| 3,103,547 | 9/1963 | Ansley | 174—68.5 |
| 3,424,854 | 1/1969 | Baxter | 174—68.5 |

JOHN F. CAMPBELL, Primary Examiner

R. W. CHURCH, Assistant Examiner

U.S. Cl. X.R.

29—471.9, 503; 174—68.5; 317—101; 339—17